(12) United States Patent (10) Patent No.: US 9,672,896 B2
Chun (45) Date of Patent: Jun. 6, 2017

(54) SEMICONDUCTOR MEMORY DEVICE AND SEMICONDUCTOR SYSTEM HAVING THE SAME

(71) Applicant: SK hynix Inc., Gyeonggi-do (KR)

(72) Inventor: Ki-Chang Chun, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/731,175

(22) Filed: Jun. 4, 2015

(65) Prior Publication Data

US 2016/0180915 A1    Jun. 23, 2016

(30) Foreign Application Priority Data

Dec. 19, 2014 (KR) .......................... 10-2014-0184548

(51) Int. Cl.
| | |
|---|---|
| *G11C 7/10* | (2006.01) |
| *G11C 7/06* | (2006.01) |
| *G11C 8/00* | (2006.01) |
| *G11C 8/16* | (2006.01) |
| *G11C 11/4093* | (2006.01) |

(52) U.S. Cl.
CPC ........ *G11C 11/4093* (2013.01); *G11C 7/1066* (2013.01); *G11C 7/1012* (2013.01); *G11C 2207/2254* (2013.01)

(58) Field of Classification Search
USPC ...... 365/189.05, 189.07, 189.17, 193, 233.1, 365/233.13
See application file for complete search history.

(56) References Cited

U.S. PATENT DOCUMENTS

| | | | | |
|---|---|---|---|---|
| 5,920,511 A | * | 7/1999 | Lee ....................... | G11C 7/1066 365/189.05 |
| 6,115,322 A | * | 9/2000 | Kanda .................. | G11C 7/1078 365/189.05 |
| 6,947,334 B2 | * | 9/2005 | Shin ..................... | G11C 7/1051 365/193 |
| 6,987,704 B2 | * | 1/2006 | Park ..................... | G11C 7/1042 365/193 |
| 7,715,252 B2 | * | 5/2010 | Lee ....................... | G11C 7/1078 365/193 |
| 7,975,162 B2 | * | 7/2011 | Kim ..................... | G11C 7/1078 365/233.1 |
| 7,990,782 B2 | * | 8/2011 | Lee ....................... | G11C 7/1078 365/233.1 |
| 8,072,822 B2 | * | 12/2011 | Jeong ................... | G11C 7/1078 365/189.05 |

(Continued)

FOREIGN PATENT DOCUMENTS

| | | |
|---|---|---|
| KR | 1020020049386 | 6/2002 |
| KR | 100838365 | 6/2008 |

(Continued)

*Primary Examiner* — Trong Phan
(74) *Attorney, Agent, or Firm* — IP & T Group LLP (57) ABSTRACT

A semiconductor memory device may include: a data alignment signal generation unit suitable for generating an alignment signal corresponding to an input speed of data; a data alignment unit suitable for aligning the data in response to the alignment signal to output aligned data; and a state data storage unit suitable for storing the aligned data in response to a control signal which is activated at a given time.

10 Claims, 8 Drawing Sheets

(56) References Cited

U.S. PATENT DOCUMENTS

| | | | | |
|---|---|---|---|---|
| 8,189,400 B2* | 5/2012 | Kim | ............ | G11C 7/1078 |
| | | | | 365/189.17 |
| 8,259,519 B2* | 9/2012 | Lee | ............ | G11C 7/1006 |
| | | | | 365/189.05 |
| 8,305,819 B2* | 11/2012 | Kim | ............ | G11C 7/10 |
| | | | | 365/189.05 |
| 8,456,924 B2* | 6/2013 | Song | ............ | G11C 7/1006 |
| | | | | 365/189.05 |

FOREIGN PATENT DOCUMENTS

| KR | 1020110012804 | 2/2011 |
|---|---|---|
| KR | 1020120098325 | 9/2012 |

* cited by examiner

SEMICONDUCTOR MEMORY DEVICE AND SEMICONDUCTOR SYSTEM HAVING THE SAME

CROSS-REFERENCE TO RELATED APPLICATIONS

The present application claims priority of Korean Patent Application No. 10-2014-0184548, filed on Dec. 19, 2014, which is incorporated herein by reference in its entirety.

BACKGROUND

1. Field

Exemplary embodiments of the present invention relate to a semiconductor design technology and, more particularly, to a semiconductor memory device including a circuit for storing an operation state thereof.

2. Description of the Related Art

Semiconductor devices, such as Double Data Rate Synchronous Dynamic Random Access Memory (DDR SDRAM), have circuits used to set their operation states. The circuits may include a mode register set. The operation states of a semiconductor memory device may include Column Address Strobe (CAS) latency, burst type, a burst length, bank grouping mode, and DLL on/off. The mode register set may store data corresponding to the operation state in response to a signal inputted from an external controller. More specifically, the semiconductor memory device may enable a setting operation of the mode register set in response to an external command signal, and store desired data in the mode register set based on data inputted through an address pin. Then, the semiconductor memory device may set the operation state thereof based on the data stored in the mode register set.

Recently, semiconductor memory devices have developed to suit a variety of requests from users. This means that the operation states of semiconductor memory devices have diversified. The diversification of the operation states may indicate that more data and more varieties of data are stored in the mode register set. Thus, it is likely that the configurations and operations of circuits related to the mode register set may change in various ways.

SUMMARY

Various embodiments are directed to a semiconductor memory device capable of processing data according to an operation mode.

In an embodiment, a semiconductor memory device may include: a data alignment signal generation unit suitable for generating an alignment signal corresponding to an input speed of data; a data alignment unit suitable for aligning the data in response to the alignment signal to output aligned data; and a state data storage unit suitable for storing the aligned data in response to a control signal that is activated at a given time.

The input speed of the data may differ depending on a normal operation mode and a state loading operation mode.

The alignment signal generation unit may include: a plurality of signal generation units suitable for generating first and second alignment signals in response to an internal clock signal; and a select output unit suitable for outputting the alignment signal by selecting one of the first and second alignment signals in response to a mode signal denoting an operation mode corresponding to the input speed of the data.

The select output unit may select the first alignment signal during a normal operation mode, and selects the second alignment signal during a state loading operation mode, and the second alignment signal may include a plurality of pulse signals which are sequentially shifted in response to the internal clock signal.

The semiconductor memory device may further include: a control signal generation unit suitable for generating the control signal in response to a mode signal denoting an operation mode corresponding to the input speed of the data; and a data transmission unit suitable for transmitting the aligned data to the state data storage unit in response to the control signal.

The state data storage unit may comprise a mode register set.

The semiconductor memory device may further include: a detection unit suitable for detecting the input speed of the data which toggle at a preset cycle.

The detection unit may count the data during a predetermined time.

The detection unit may compare values of the data which are consecutively inputted.

The detection unit may include: a first latching unit suitable for latching the data in response to a rising edge of a clock; a second latching unit suitable for latching the data in response to a falling edge of the clock; and a comparison unit suitable for comparing the data latched in the first and second latching units and outputting a mode signal denoting an operation mode corresponding to the input speed of the data.

In an embodiment, a semiconductor system may include: a semiconductor memory device suitable for detecting an input speed of data inputted thereto using the data, and aligning the data in response to the input speed of the data; and a controller suitable for providing the data and controlling the semiconductor memory device.

The data may be inputted to the semiconductor memory device at different speeds during a normal operation mode and a state loading operation mode.

The semiconductor memory device may include: a detection unit suitable for detecting the input speed of the data to output a mode signal denoting an operation mode corresponding to the input speed of the data; a data alignment signal generation unit suitable for generating an alignment signal in response to the mode signal; a data alignment unit suitable for aligning the data in response to the alignment signal to output aligned data; and a state data storage unit suitable for storing the aligned data in response to a control signal which is activated at a given time.

The detection unit may count the data during a preset time.

The detection unit may compare values of the data which are consecutively inputted.

The detection unit may include: a first latching unit suitable for latching the data in response to a first edge of a clock; a second latching unit suitable for latching the data in response to a second edge of the clock; and a comparison unit suitable for comparing the data latched in the first and second latching units and outputting the mode signal.

The alignment signal generation unit may include: a plurality of signal generation units suitable for generating first and second alignment signals in response to an internal clock signal; and a select output unit suitable for outputting the alignment signal by selecting one of the first and second alignment signals in response to the mode signal.

The select output unit may select the first alignment signal during a normal operation mode, and selects the second alignment signal during a state loading operation mode, and the second alignment signal may include a plurality of pulse signals which are sequentially shifted in response to the internal clock signal.

The semiconductor memory device may further include: a control signal generation unit suitable for generating the control signal in response to the mode signal; and a data transmission unit suitable for transmitting the aligned data to the state data storage unit in response to the control signal.

The state data storage unit may comprise a mode register set.

The semiconductor memory device in accordance with the embodiment of the present invention may change the data processing method according to a normal operation mode and a state loading operation mode, thereby guaranteeing an optimized circuit operation while data are processed.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts in the various figures and embodiments of the present invention.

Figure 1:
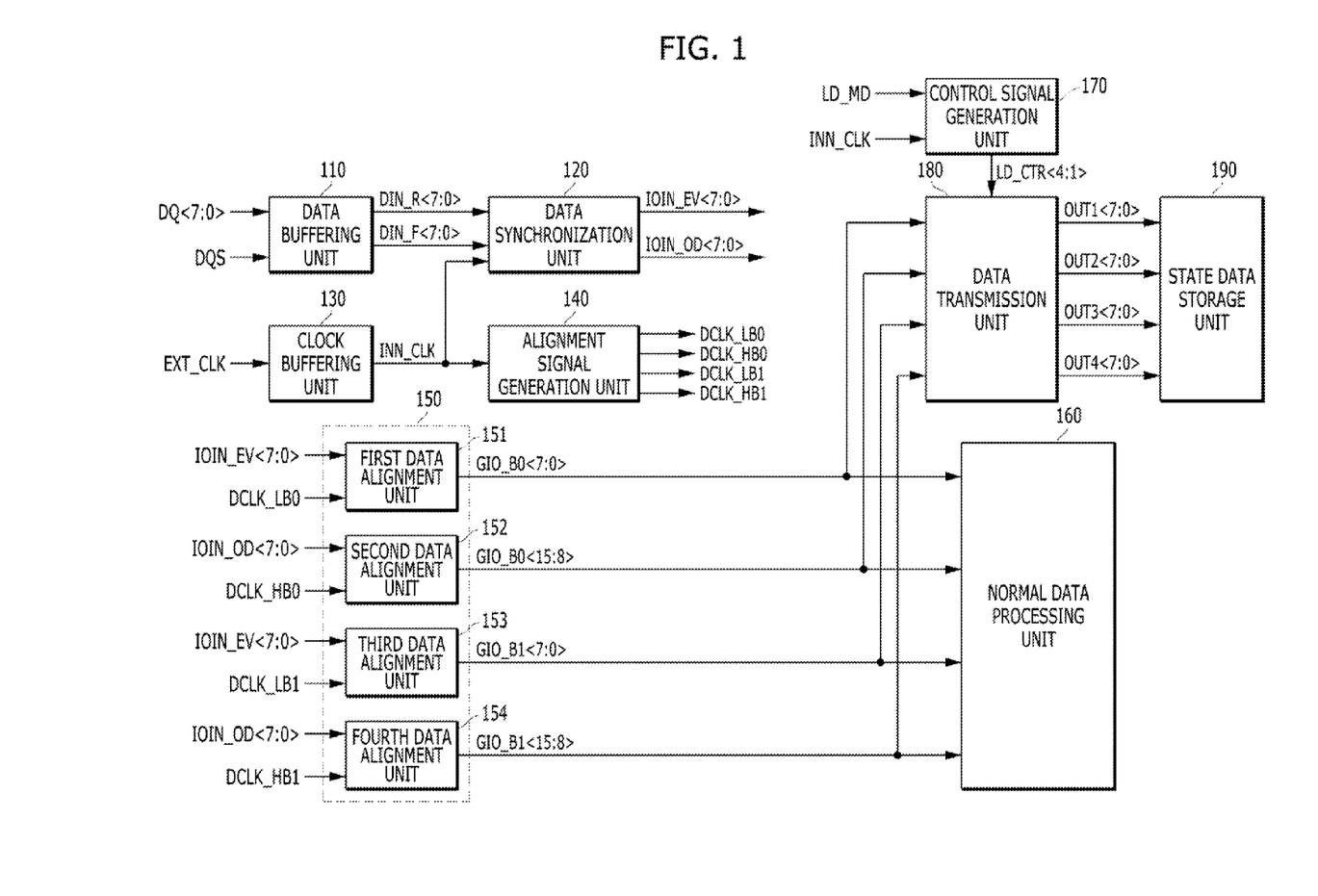
FIG. 1 is a block diagram illustrating a semiconductor memory device in accordance with an embodiment of the present invention.

FIG. 1 is a block diagram illustrating a semiconductor memory device in accordance with an embodiment of the present invention.

Referring to FIG. 1, the semiconductor memory device may include a data buffering unit 110, a data synchronization unit 120, a clock buffering unit 130, an alignment signal generation unit 140, a plurality of data alignment units 150, a normal data processing unit 160, a control signal generation unit 170, a data transmission unit 180, and a state data storage unit 190.

The data buffering unit 110 may buffer a plurality of data DQ<7:0> inputted through a plurality of pads in response to a data strobe signal DQS. The data buffering unit 110 may output the plurality of data DQ<7:0> in response to rising and falling edges of the data strobe signal DQS. The data outputted in response to the rising edges may be referred to as a plurality of rising data DIN_R<7:0>, and the data outputted in response to the falling edges may be referred to as a plurality of falling data DIN_F<7:0>.

The data synchronization unit 120 may synchronize the plurality of rising data DIN_R<7:0> and the plurality of falling data DIN_F<7:0> with an internal clock signal INN_CLK, and output the synchronized data. The synchronized data corresponding to the plurality of rising data DIN_R<7:0> may be referred to as a plurality of even data IOIN_EV<7:0>, and the synchronized data corresponding to the plurality of falling data DIN_F<7:0> may be referred to as a plurality of odd data IOIN_OD<7:0>.

The clock buffering unit 130 may generate the internal clock signal INN_CLK by buffering an external clock signal EXT_CLK, and the alignment signal generation unit 140 may generate a plurality of internal alignment signals DCLK_LB0, DCLK_HB0, DCLK_LB1, and DCLK_HB1 which are used to align the plurality of odd data IOIN_OD<7:0> and the plurality of even data IOIN_EV<7:0>, in response to the internal clock signal INN_CLK. Hereafter, for convenience, the plurality of internal alignment signals DCLK_LB0, DCLK_HB0, DCLK_LB1, and DCLK_HB1 will be referred to as first to fourth internal alignment signals DCLK_LB0, DCLK_HB0, DCLK_LB1, and DCLK_HB1.

The plurality of data alignment units 150 may include first to fourth data alignment units 151 to 154 to align the plurality of odd data IOIN_OD<7:0> and the plurality of even data IOIN_EV<7:0> and output aligned data GIO_B0<7:0>, GIO_B0<15:8>, GIO_B1<7:0>, and GIO_B1<15:8> in response to the first to fourth internal alignment signals DCLK_LB0, DCLK_HB0, DCLK_LB1, and DCLK_HB1. The first data alignment unit 151 may align the plurality of even data IOIN_EV<7:0> in response to the first internal alignment signal DCLK_LB0, the second data alignment unit 152 may align the plurality of odd data IOIN_OD<7:0> in response to the second internal alignment signal DCLK_HB0, the third data alignment unit 153 may align the plurality of even data IOIN_EV<7:0> in response to the third internal alignment signal DCLK_LB1, and the fourth data alignment unit 154 may align the plurality of odd data IOIN_OD<7:0> in response to the fourth internal alignment signal DCLK_HB1.

The normal data processing unit 160 may receive and process the aligned data GIO_B0<7:0>, GIO_B0<15:8>, GIO_B1<7:0>, and GIO_B1<15:8> according to a predetermined circuit operation. The processed data may be stored in a memory bank including a plurality of memory cells.

The control signal generation unit 170 may generate first to fourth loading control signals LD_CTR<4:1> in response to the internal clock signal INN_CLK and a loading mode signal LD_MD which is activated during a mode for storing an operation state (hereafter, referred to as a 'state loading operation mode'). The data transmission unit 180 may transmit the aligned data GIO_B0<7:0>, GIO_B0<15:8>, GIO_B1<7:0>, and GIO_B1<15:8> as first to fourth state data OUT1<7:0>, OUT2<7:0>, OUT3<7:0>, and OUT4<7:0> from the data alignment units 150 to the state data storage unit 190 in response to the first to fourth loading control signals LD_CTR<4:1>. In the state loading operation mode, operation state-related data may be transmitted as the aligned data GIO_B0<7:0>, GIO_B0<15:8>, GIO_B1<7:0>, and GIO_B1<15:8> from the data alignment units 150.

The data transmission unit 180 may transmit the aligned data GIO_B0<7:0>, GIO_B0<15:8>, GIO_B1<7:0>, and GIO_B1<15:8> as the first to fourth state data OUT1<7:0>, OUT2<7:0>, OUT3<7:0>, and OUT4<7:0> to the state data storage unit 190 in response to the first to fourth loading control signals LD_CTR<4:1>. The state data storage unit 190 may store the first to fourth state data OUT1<7:0>, OUT2<7:0>, OUT3<7:0>, and OUT4<7:0> outputted from the data transmission unit 180. The first to fourth state data OUT1<7:0>, OUT2<7:0>, OUT3<7:0>, and OUT4<7:0> may be used to set an operation state of the semiconductor memory device.

Hereinafter, a normal operation mode and state loading operation mode of the semiconductor memory device will be described in detail.

Figure 2:
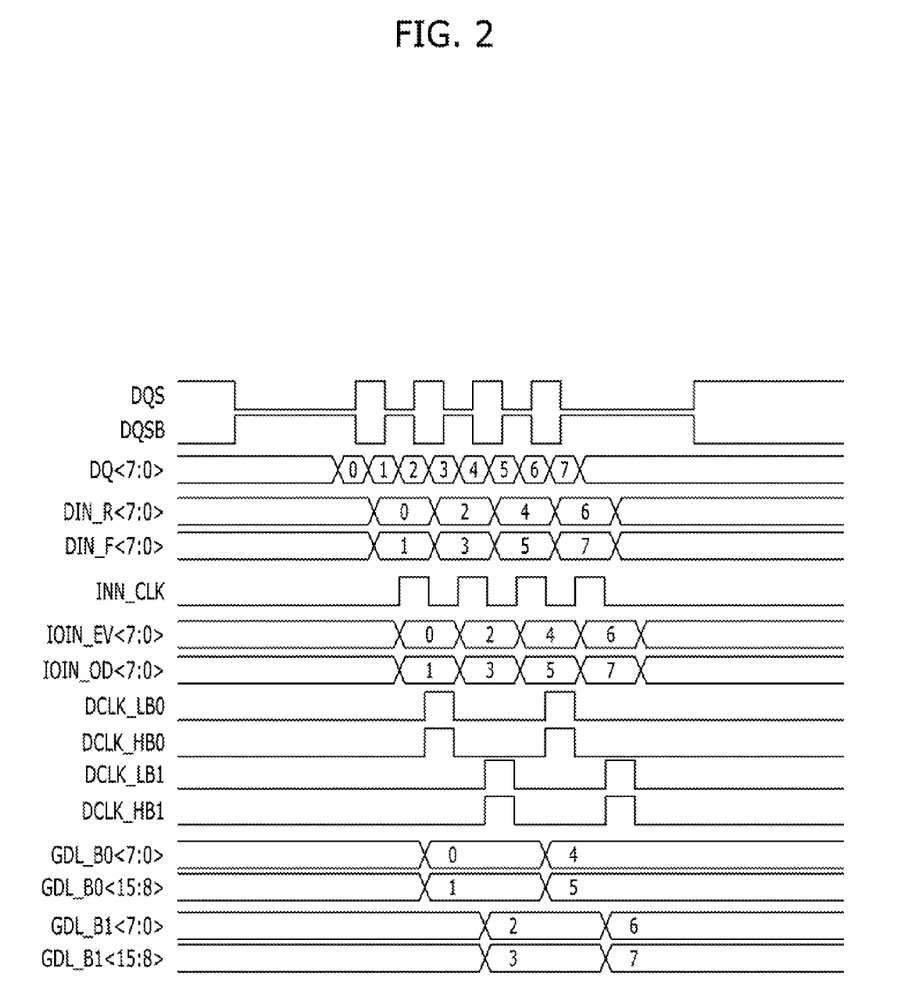
FIG. 2 is a timing diagram describing a normal operation mode of the semiconductor memory device of FIG. 1.

FIG. 2 is a timing diagram describing the normal operation mode of the semiconductor memory device of FIG. 1.

Referring to FIGS. 1 and 2, the data buffering unit 110 may buffer the data strobe signal DQS which is inputted with the plurality of data DQ<7:0> while toggling, and generate a data strobe signal bar DQSB. The data strobe signal bar DQSB may have the opposite phase of the data strobe signal DQS. The data buffering unit 110 may buffer the plurality of data DQ<7:0> in response to rising edges of the data strobe signal DQS, and buffer the plurality of data DQ<7:0> in response to rising edges of the data strobe signal bar DQSB. For reference, data '0' to '7' corresponding to the plurality of data DQ<7:0> in FIG. 2 may indicate eight data which are inputted in series through one pad among the plurality of data DQ<7:0> inputted through eight pads. The following descriptions will be focused on the data '0' to '7', for convenience of explanation. The plurality of rising data DIN_R<7:0> corresponding to the data strobe signal DQS may include data '0', '2', '4', and '6', and the plurality of falling data DIN_F<7:0> corresponding to the data strobe signal bar DQSB may include data '1', '3', '5', and '7'. The data synchronization unit 120 may synchronize the plurality of rising data DIN_R<7:0> and the plurality of falling data DIN_F<7:0> with the internal clock signal INN_CLK, and output the synchronized data as the plurality of even data IOIN_EV<7:0> and the plurality of odd data IOIN_OD<7:0>.

The alignment signal generation unit 140 may generate the first to fourth internal alignment signals DCLK_LB0, DCLK_HB0, DCLK_LB1, and DCLK_HB1 which are to align the plurality of odd data IOIN_OD<7:0> and the plurality of even data IOIN_EV<7:0>. The plurality of data alignment units 150 may align the plurality of odd data IOIN_OD<7:0> and the plurality of even data IOIN_EV<7:0> in response to the first to fourth internal alignment signals DCLK_LB0, DCLK_HB0, DCLK_LB1, and DCLK_HB1. Specifically, the first data alignment unit 151 may align the plurality of even data IOIN_EV<7:0> in response to the first internal alignment signal DCLK_LB0, and output the data '0' and '4' as the aligned data GIO_B0<7:0>, and the second data alignment unit 152 may align the plurality of odd data IOIN_OD<7:0> in response to the second internal alignment signal DCLK_HB0, and output the data '1' and '5' as the aligned data GIO_B0<15:8>. Furthermore, the third data alignment unit 153 may align the plurality of even data IOIN_EV<7:0> in response to the third internal alignment signal DCLK_LB1, and output the data '2' and '6' as the aligned data GIO_B1<7:0>, and the fourth data alignment unit 154 may align the plurality of odd data IOIN_OD<7:0> in response to the fourth internal alignment signal DCLK_HB1, and output the data '3' and '7' as the aligned data GIO_B1<15:8>.

Finally, the normal data processing unit 160 may receive the aligned data GIO_B0<7:0>, GIO_B0<15:8>, GIO_B1<7:0>, and GIO_B1<15:8> from the data alignment units 150, and perform a data processing operation according to a predetermined circuit operation.

In the state loading operation mode of the semiconductor memory device, data may be inputted more slowly.

Figure 3:
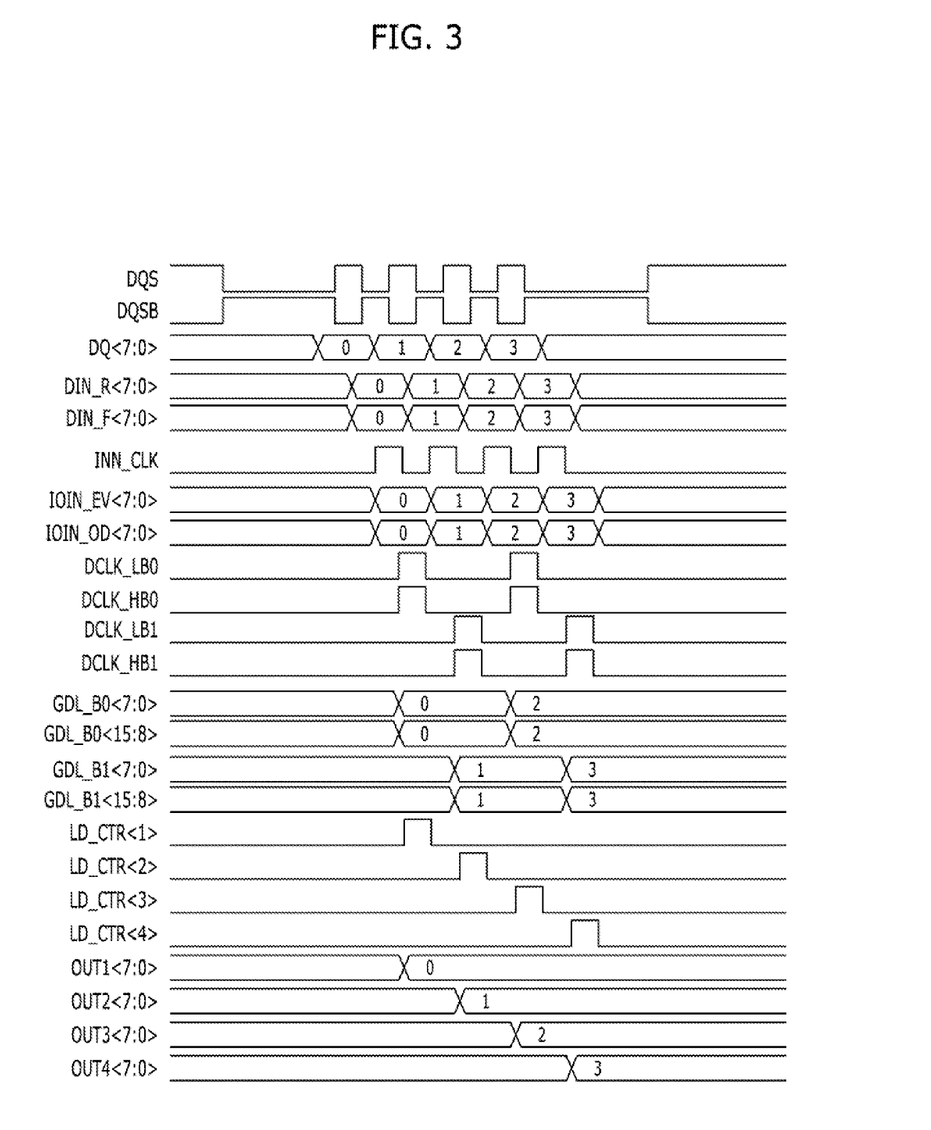
FIG. 3 is a timing diagram describing a state loading operation mode of the semiconductor memory device of FIG. 1.

FIG. 3 is a timing diagram describing the state loading operation mode of the semiconductor memory device of FIG. 1.

Referring to FIGS. 1 and 3, the plurality of data DQ<7:0> may be inputted two times slower than the plurality of data DQ<7:0> (refer to FIG. 2) inputted in the normal operation mode. Thus, the plurality of rising data DIN_R<7:0> outputted from the data buffering unit 110 may include data '0', '1', '2', and '3', and the plurality of falling data DIN_F<7:0> outputted from the data buffering unit 110 may also include data '0', '1', '2', and '3'. Furthermore, the plurality of even data IOIN_EV<7:0> and the plurality of odd data IOIN_OD<7:0> may also include data '0', '1', '2', and '3'. Thus, the aligned data GIO_B0<7:0> aligned in response to the first internal alignment signal DCLK_LB0 may become the data '0' and '2', the aligned data GI_B0<15:8> aligned in response to the second internal alignment signal DCLK_HB0 may become the data '0' and '2', the aligned data GIO_B1<7:0> aligned in response to the third internal alignment signal DLCK_LB1 may become the data '1' and '3' and the aligned data GIO_B1<15:8> aligned in response to the fourth internal alignment signal DCLK_HB1 may become the data '1' and '3'.

The control signal generation unit 170 may generate the first to fourth loading control signals LD_CTR<4:1> in response to the internal clock signal INN_CLK and the loading mode signal LD_MD. Then, the data transmission unit 180 may transmit the aligned data GIO_B0<7:0>, GIO_B0<15:8>, GIO_B1<7:0>, and GIO_B1<15:8> as the first to fourth state data OUT1<7:0>, OUT2<7:0>, OUT3<7:0>, and OUT4<7:0> from the data alignment units 150 to the state data storage unit 190 in response to the first to fourth loading control signals LD_CTR<4:1>. In other words, the first state data OUT1<7:0> corresponding to the first loading control signal LD_CTR<1> may become the data '0', the second state data OUT2<7:0> corresponding to the second loading control signal LD_CTR<2> may become the data '1', the third state data OUT3<7:0> corresponding to the third loading control signal LD_CTR<3> may become the data '2', and the fourth state data OUT4<7:0> corresponding to the fourth loading control signal LD_CTR<4> may become the data '3'. The state data storage unit 190 may store the first to fourth state data OUT1<7:0>, OUT2<7:0>, OUT3<7:0>, and OUT4<7:0> outputted form the data transmission unit 180. Then, the first to fourth state data OUT1<7:0>, OUT2<7:0>, OUT3<7:0>, and OUT4<7:0> may be used to set an operation state of the semiconductor memory device.

As illustrated in the drawings, the normal operation mode and the state loading operation mode may have different data input speeds. That is, the data of the normal operation mode may be inputted twice as fast as the data of the state loading operation mode. Hereafter, a semiconductor memory device which operates more efficiently in the normal operation mode and the state loading operation mode will be described.

Figure 4:
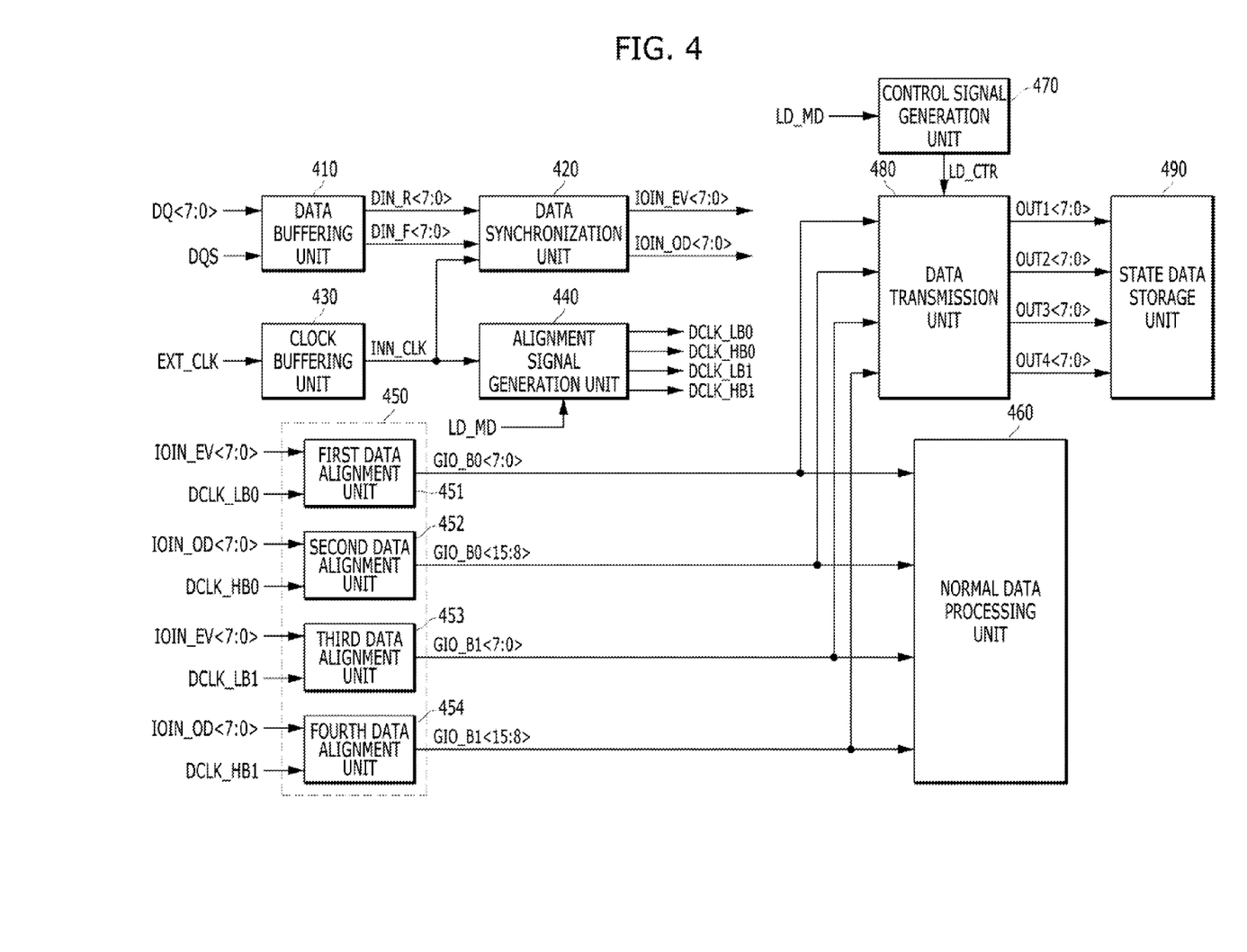
FIG. 4 is a block diagram illustrating a semiconductor memory device in accordance with another embodiment of the present invention.

FIG. 4 is a block diagram illustrating a semiconductor memory device in accordance with another embodiment of the present invention.

Referring to FIG. 4, the semiconductor memory device may include a data buffering unit 410, a data synchronization unit 420, a clock buffering unit 430, an alignment signal generation unit 440, a plurality of data alignment units 450, a normal data processing unit 460, a control signal generation unit 470, a data transmission unit 480, and a state data storage unit 490.

The data buffering unit 410 may buffer a plurality of data DQ<7:0> inputted through a plurality of pads in response to a data strobe signal DQS. The data outputted in response to rising edges may be referred to as a plurality of rising data DIN_R<7:0>, and the data outputted in response to falling edges may be referred to as a plurality of falling data DIN_F<7:0>.

The data synchronization unit 420 may synchronize the plurality of rising data DIN_R<7:0> and the plurality of falling data DIN_F<7:0> with an internal clock signal INN_CLK, and output the synchronized data. The synchronized data corresponding to the plurality of rising data DIN_R<7:0> may be referred to as a plurality of even data IOIN_EV<7:0>, and the synchronized data corresponding to the plurality of falling data DIN_F<7:0> may be referred to as a plurality of odd data IOIN_OD<7:0>.

The clock buffering unit 430 may generate the internal clock signal INN_CLK by buffering an external clock signal EXT_CLK. The alignment signal generation unit 440 may generate a plurality of internal alignment signals DCLK_LB0, DCLK_HB0, DCLK_LB1, and DCLK_HB1 in response to the internal clock signal INN_CLK and a loading mode signal LD_MD. Thus, the alignment signal generation unit 440 may generate the plurality of internal alignment signals DCLK_LB0, DCLK_HB0, DCLK_LB1, and DCLK_HB1 corresponding to data input speeds of the normal operation mode and the state loading operation mode. The plurality of internal alignment signals DCLK_LB0, DCLK_HB0, DCLK_LB1, and DCLK_HB1 generated in the normal operation mode are different from the plurality of internal alignment signals DCLK_LB0, DCLK_HB0, DCLK_LB1, and DCLK_HB1 generated in the state loading operation mode. The plurality of internal alignment signals DCLK_LB0, DCLK_HB0, DCLK_LB1, and DCLK_HB1 generated in the normal operation mode may be used to align the plurality of odd data IOIN_OD<7:0> and the plurality of even data IOIN_EV<7:0>, and correspond to the signals generated in the normal operation mode of FIG. 1. The plurality of internal alignment signals DCLK_LB0, DCLK_HB0, DCLK_LB1, and DCLK_HB1 generated in the state loading operation mode may be sequentially activated, and will be described in more detail with reference to an operation timing diagram. Hereafter, the plurality of internal alignment signals DCLK_LB0, DCLK_HB0, DCLK_LB1, and DCLK_HB1 will be referred to as first to fourth internal alignment signals DCLK_LB0, DCLK_HB0, DCLK_LB1, and DCLK_HB1.

The plurality of data alignment units 450 may include first to fourth data alignment units 451 to 454 to align the plurality of odd data IOIN_OD<7:0> and the plurality of even data IOIN_EV<7:0> and output aligned data GIO_B0<7:0>, GIO_B0<15:8>, GIO_B1<7:0>, and GIO_B1<15:8> in response to the first to fourth internal alignment signals DCLK_LB0, DCLK_HB0, DCLK_LB1, and DCLK_HB1. The first data alignment unit 451 may align the plurality of even data IOIN_EV<7:0> in response to the first internal alignment signal DCLK_LB0, the second data alignment unit 452 may align the plurality of odd data IOIN_OD<7:0> in response to the second internal alignment signal DCLK_HB0, the third data alignment unit 453 may align the plurality of even data IOIN_EV<7:0> in response to the third internal alignment signal DCLK_LB1, and the fourth data alignment unit 454 may align the plurality of odd data IOIN_OD<7:0> in response to the fourth internal alignment signal DCLK_HB1. The normal data processing unit 450 may receive and process the aligned data GIO_B0<7:0>, GIO_B0<15:8>, GIO_B1<7:0>, and GIO_B1<15:8> according to a predetermined circuit operation. The processed data may be stored in a memory bank including a plurality of memory cells.

The control signal generation unit 470 may generate a loading control signal LD_CTR which is activated at a predetermined time in response to the loading mode signal LD_MD. The semiconductor memory device in accordance with the embodiment of the present invention may secure a sufficient margin for the loading control signal LD_CTR and data to be processed during the state loading operation mode. Thus, the semiconductor memory device may process the data through the optimized circuit operation.

The data transmission unit 480 may transmit the aligned data GIO_B0<7:0>, GIO_B0<15:8>, GIO_B1<7:0>, and GIO_B1<15:8> as first to fourth state data OUT1<7:0>, OUT2<7:0>, OUT3<7:0>, and OUT4<7:0> from the data alignment units 450 to the state data storage unit 490 in response to the loading control signal LD_CTR. In the state loading operation mode, operation state-related data may be transmitted as the aligned data GIO_B0<7:0>, GIO_B0<15:8>, GIO_B1<7:0>, and GIO_B1<15:8> from the data alignment units 150. The data transmission unit 480 may transmit the aligned data GIO_B0<7:0>, GIO_B0<15:8>, GIO_B1<7:0>, and GIO_B1<15:8> as the first to fourth state data OUT1<7:0>, OUT2<7:0>, OUT3<7:0>, and OUT4<7:0> to the state data storage unit 490 in response to the loading control signal LD_CTR. The state data storage unit 490 may store the first to fourth state data OUT1<7:0>, OUT2<7:0>, OUT3<7:0>, and OUT4<7:0> outputted from the data transmission unit 480. Then, the first to fourth state data OUT1<7:0>, OUT2<7:0>, OUT3<7:0>, and OUT4<7:0> may be used to set an operation state of the semiconductor memory device. The state data storage unit 490 may include a mode register set.

The semiconductor memory device in accordance with the embodiment of the present invention may generate the plurality of internal alignment signals DCLK_LB0, DCLK_HB0, DCLK_LB1, and DCLK_HB1 according to an operation mode. Thus, the semiconductor memory device may perform an optimized circuit operation in response to the operation mode.

Figure 5:
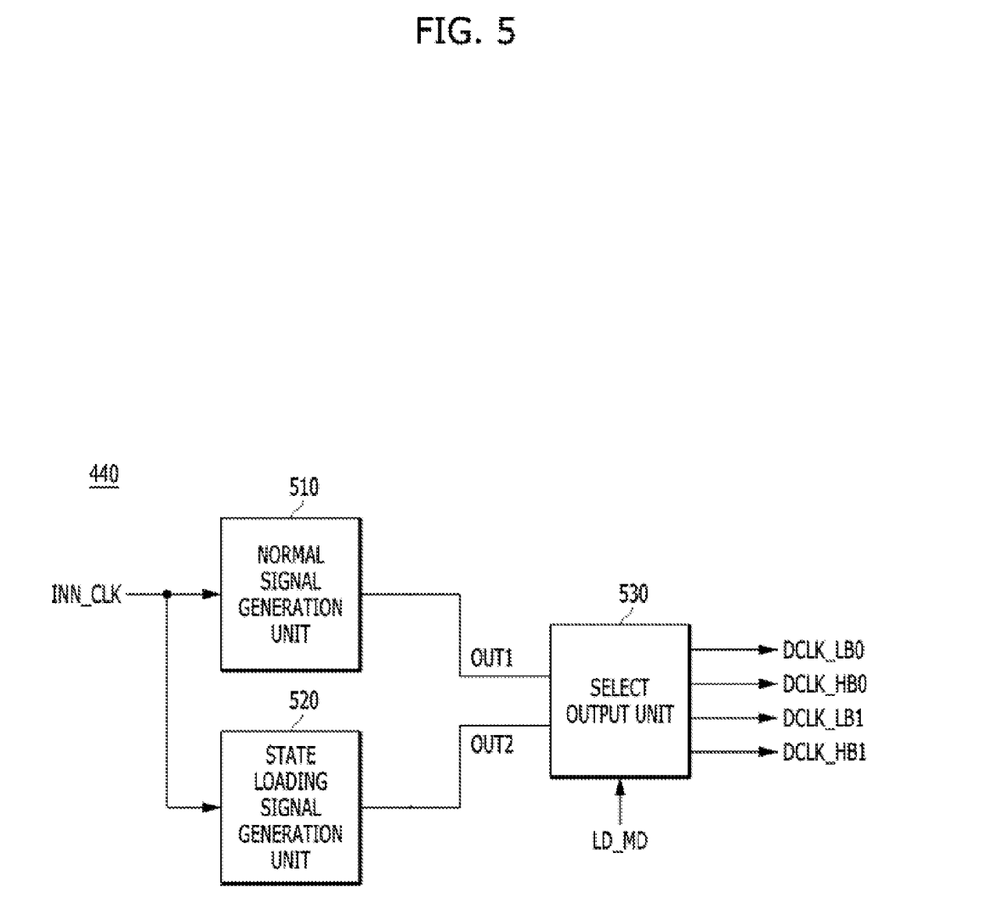
FIG. 5 is a block diagram illustrating an alignment signal generation unit of FIG. 4.

FIG. 5 is a block diagram illustrating the alignment signal generation unit 440 of FIG. 4.

Referring to FIG. 5, the alignment signal generation unit 440 may include a normal signal generation unit 510, a state loading signal generation unit 520, and a select output unit 530.

The normal signal generation unit 510 may generate a first output signal OUT1 which is used to align the plurality of odd data IOIN_OD<7:0> and the plurality of even data IOIN_EV<7:0> (refer to FIG. 4) inputted during the normal operation mode, in response to the internal clock signal INN_CLK. The state loading signal generation unit 520 may generate a second output signal OUT2 which is used to align the plurality of odd data IOIN_OD<7:0> and the plurality of even data IOIN_EV<7:0> inputted during the state loading operation mode, in response to the internal clock signal INN_CLK. As described above with reference to FIGS. 2 and 3, the data input speed of the normal operation mode is different from the data input speed of the state loading operation mode. That is, the data input speed of the normal operation mode is twice as fast as the data input speed of the state loading operation mode. Thus, the first output signal OUT1 generated through the normal signal generation unit 510 is different than the second output signal OUT2 generated through the state loading signal generation unit 520. For reference, the first output signal OUT1 may include the first to fourth internal alignment signals DCLK_LB0, DCLK_HB0, DCLK_LB1, and DCLK_HB1 of FIG. 2, and the second output signal OUT2 may include the first to fourth internal alignment signals DCLK_LB0, DCLK_HB0, DCLK_LB1, and DCLK_HB1 of which pulse signals are sequentially shifted in response to the internal clock signal INN_CLK.

The select output unit 530 may select one of the first output signal OUT1 and the second output signal OUT2 to output the first to fourth internal alignment signals DCLK_LB0, DCLK_HB0, DCLK_LB1, and DCLK_HB1 in response to the loading mode signal LD_MD.

The semiconductor memory device in accordance with the embodiment of the present invention may generate the first to fourth internal alignment signals DCLK_LB0, DCLK_HB0, DCLK_LB1, and DCLK_HB1 corresponding to the operation mode, and align the plurality of input data DQ<7:0> in response to first to fourth internal alignment signals DCLK_LB0, DCLK_HB0, DCLK_LB1, and DCLK_HB1.

Figure 6:
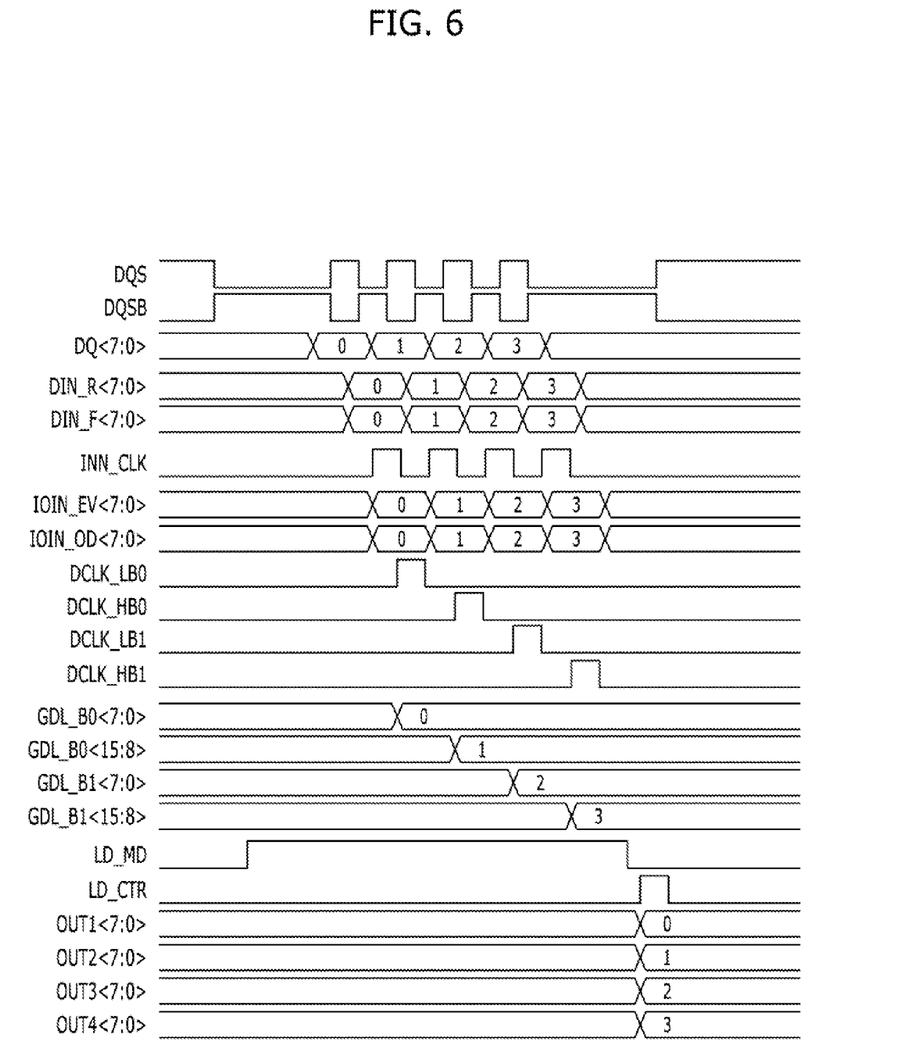
FIG. 6 is a timing diagram describing a state loading operation mode of FIG. 4.

FIG. 6 is a timing diagram describing the state loading operation mode of FIG. 4.

Referring to FIGS. 4 to 6, the plurality of data DQ<7:0> may be inputted two times slower than the plurality of data DQ<7:0> inputted in the normal operation mode (refer to FIG. 2). Thus, the plurality of rising data DIN_R<7:0> outputted from the data buffering unit 410 may include data '0', '1', '2', and '3', and the plurality of falling data DIN_F<7:0> outputted from the data buffering unit 110 may include data '0', '1', '2', and '3'. The plurality of even data IOIN_EV<7:0> and the plurality of odd data IOIN_OD<7:0> may also include data '0', '1', '2', and '3'.

The state loading signal generation unit 520 of FIG. 5 may generate the second output signal OUT2 including the first to fourth internal alignment signals DCLK_LB0, DCLK_HB0, DCLK_LB1, and DCLK_HB1 of which pulse signals are sequentially shifted in response to the internal clock signal INN_CLK. Thus, the plurality of data alignment units 450 may sequentially output the aligned data GIO_B0<7:0>, GIO_B0<15:8>, GIO_B1<7:0>, and GIO_B1<15:8> in response to the first to fourth internal alignment signals DCLK_LB0, DCLK_HB0, DCLK_LB1, and DCLK_HB1. That is, the aligned data GIO_B0<7:0> aligned in response to the first internal alignment signal DCLK_LB0 may become data '0', the aligned data GIO_B0<15:8> aligned in response to the second internal alignment signal DCLK_HB0 may become data '1', the aligned data GIO_B1<7:0> aligned in response to the third internal alignment signal DLCK_LB1 may become data '2', and the aligned data GIO_B1<15:> aligned in response to the fourth internal alignment signal DCLK_HB1 may become data '3'.

The control signal generation unit 470 may generate the loading control signal LD_CTR which is a pulse signal activated in response to the loading mode signal LD_MD. As illustrated in the drawing, the loading control signal LD_CTR and the aligned data GIO_B0<7:0>, GIO_B0<15:8>, GIO_B1<7:0>, and GIO_B1<15:8> of the data alignment units 450 may secure a sufficient margin. Thus, the data transmission unit 480 may stably output the first to fourth state data OUT1<7:0>, OUT2<7:0>, OUT3<7:0>, and OUT4<7:0>, and the state data storage unit 490 may also stably store the first to fourth state data OUT1<7:0>, OUT2<7:0>, OUT3<7:0>, and OUT4<7:0>.

The semiconductor memory device in accordance with the embodiment of the present invention may secure a sufficient margin for the loading control signal LD_CTR and the aligned data GIO_B0<7:0>, GIO_B0<15:8>, GIO_B1<7:0>, and GIO_B1<15:8> of the data alignment units 450 during the state loading operation mode.

The loading mode signal LD_MD activated in the state loading operation mode may be generated through various methods depending on design. The loading mode signal LD_MD may be generated outside or inside the semiconductor memory device. For example, the loading mode signal LD_MD may be generated by detecting the input speed of data, and will be described below with reference to embodiments of FIGS. 7 and 8.

Figure 7:
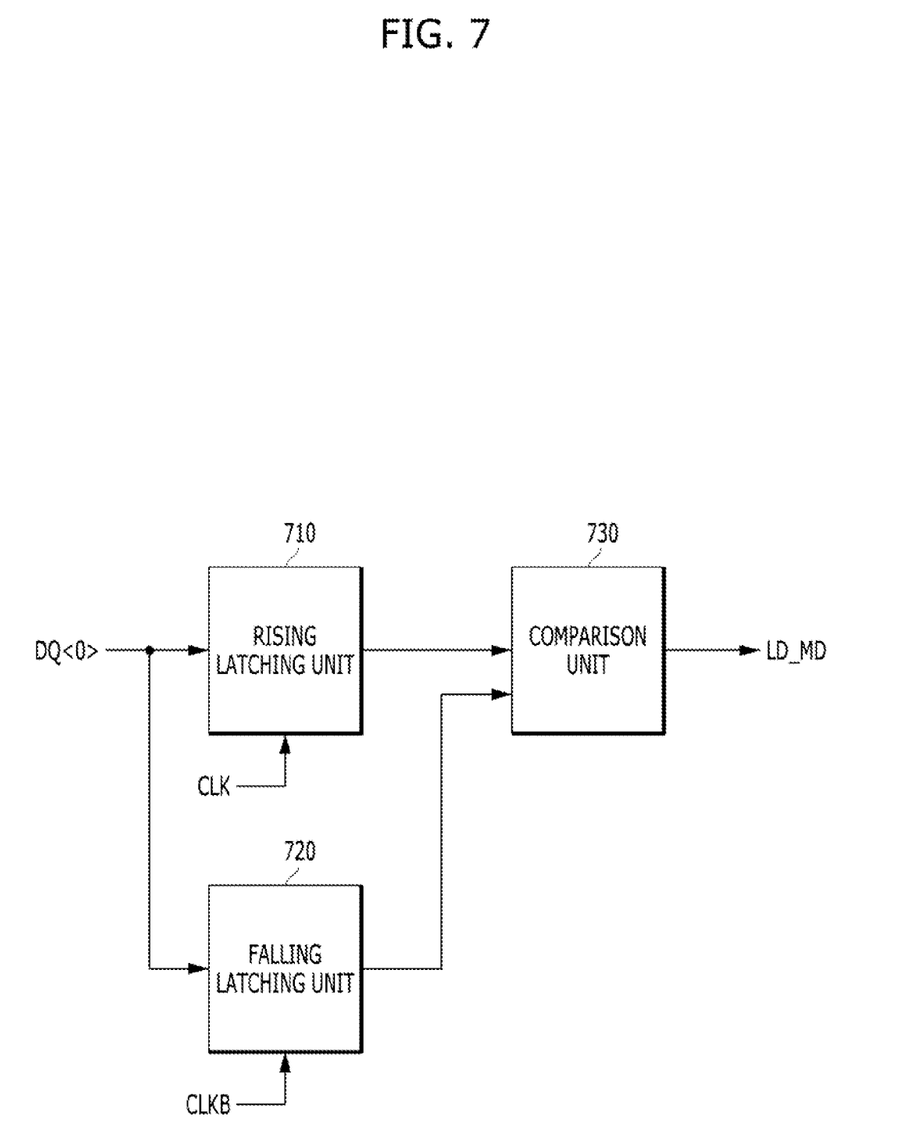
FIG. 7 is a block diagram describing a detection unit in accordance with an embodiment of the present invention.

FIG. 7 is a block diagram describing a detection unit in accordance with the embodiment of the present invention.

Referring to FIG. 7, the detection unit may generate the loading mode signal LD_MD by comparing logic values of data DQ<0> which are consecutively inputted. The detection unit may include a rising latching unit 710, a falling latching unit 720, and a comparison unit 730. Though the data DQ<0> is explained as an example, any of the plurality of data DQ<7:0> may be used. The input data DQ<0> may toggle at a preset cycle during a predetermined period. The semiconductor memory device may receive the data DQ<0>.

The rising latching unit 710 may latch the data DQ<0> at a rising edge of a clock signal CLK, and the falling latching unit 720 may latch the data DQ<0> at a falling edge of the clock signal CLK. FIG. 7 illustrates an example in which a clock bar signal CLKB having the opposite phase to the clock signal CLK is inputted to the falling latching unit 720 to latch the data DQ<0> at the falling edge of the dock signal CLK. The comparison unit 730 may compare the data latched in the rising latching unit 710 to the data latched in the falling latching unit 720, and generate the loading mode signal LD_MD.

The data inputted to the comparison unit 730 may be divided into two cases. One case is where the data latched in the rising latching unit 710 is different from the data latched in the falling latching unit 720, and the other case is where the data latched in the rising latching unit 710 is the same as the data latched in the falling latching unit 720. When the data latched in the rising latching unit 710 is different from the data latched in the falling latching unit 720, it may indicate that the data input speed is fast. Thus, the detection unit may generate the loading mode signal LD_MD corresponding to the normal operation mode. On the other hand, when the data latched in the rising latching unit 710 is the same as the data latched in the falling latching unit 720, it may indicate that the data input speed is slow. Thus, the detection unit may generate the loading mode signal LD_MD corresponding to the state loading operation mode.

The semiconductor memory device in accordance with the embodiment of the present invention may compare the values of data that are inputted consecutively, and generate the loading mode signal LD_MD.

Figure 8:
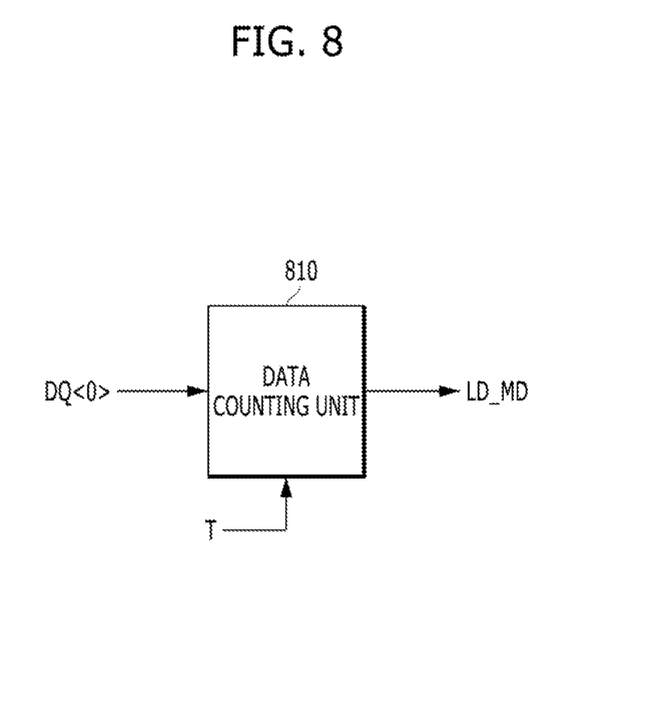
FIG. 8 is a block diagram illustrating a data counting unit in accordance with an embodiment of the present invention.

FIG. 8 is a block diagram illustrating a data counting unit 810 in accordance with an embodiment of the present invention.

Referring to FIG. 8, the data counting unit 810 may count the data DQ<0> inputted during a predetermined time T, and generate the loading mode signal LD_MD based on the counting result. Though the data DQ<0> is explained as an example, any of the plurality of data DQ<7:0> may be used as the data DQ<0>. At this time, the input data DQ<0> may toggle at a preset cycle. The semiconductor memory device may receive the data DQ<0>.

The data counting unit 810 may count the amount of data DQ<0> inputted during the predetermined time T corresponding to one cycle of the data strobe signal DQS, for example. Thus, the data counting unit 810 may generate the loading mode signal LD_MD corresponding to the normal operation mode when two data DQ<0> are inputted during the predetermined time T corresponding to one cycle of the data strobe signal DQS, and generate the loading mode signal LD_MD corresponding to the state loading operation mode when one data DQ<0> is inputted during the predetermined time T. When two data DQ<0> are inputted during the predetermined time T, it may indicate that the data input speed is fast, and when one data DQ<0> is inputted during the predetermined time T, it may indicate that the data input speed is slow.

The semiconductor memory device in accordance with the embodiment of the present invention may detect the input speed of the data DQ<0> by counting the data DQ<0> inputted during the predetermined time T, and generate the loading mode signal LD_MD based on the detection result.

Figure 9:
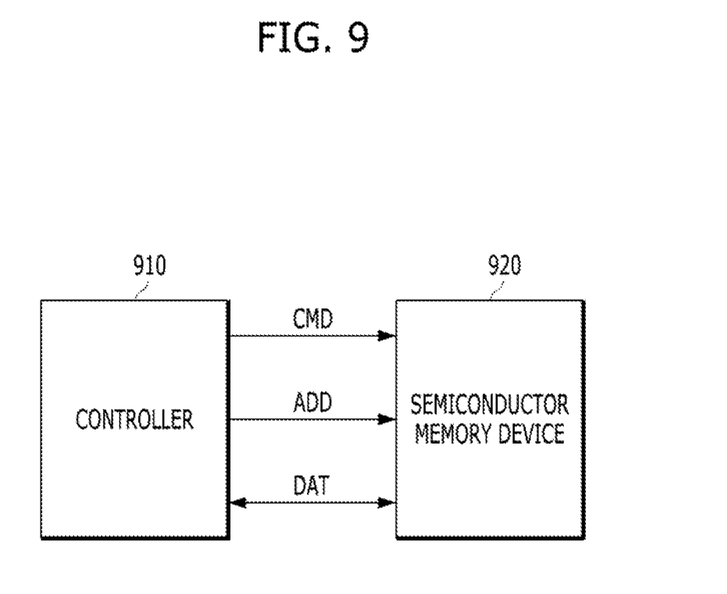
FIG. 9 is a block diagram illustrating a semiconductor system in accordance with an embodiment of the present invention.

FIG. 9 is a block diagram illustrating a semiconductor system in accordance with an embodiment of the present invention.

Referring to FIG. 9, the semiconductor system may include a controller 910 and a semiconductor memory device 920.

The controller 910 may control the semiconductor memory device 920, and transmit and receive various signals to and from the semiconductor memory device 920. For example, the controller 910 may control a data write operation of storing data in the semiconductor memory device 920 and a data read operation of outputting the stored data from the semiconductor memory device 920. For this operation, the controller 910 and the semiconductor memory device 920 may transmit or receive a command CMD, data DAT, and an address ADD.

The semiconductor memory device 920 may include the data counting unit 810 of FIG. 8. According to this configuration, the semiconductor memory device 920 may detect the input speed of the data DAT received from the controller 910. That is, the semiconductor memory device 920 may detect the input speed of the data DAT based on the data DAT, and align the data DAT in response to the detected input speed. In other words, the semiconductor memory device 920 may detect the input speed of the data DAT based on the data DAT inputted during the normal operation mode, and align the data DAT in response to the input speed. Furthermore, the semiconductor memory device 920 may detect the input speed of the data DAT based on the data DAT inputted during the state loading operation mode, and align the data DAT in response to the detected input speed.

The semiconductor system in accordance with the embodiment of the present invention may detect the operation mode even though a separate signal corresponding to the normal operation mode or state loading operation mode is not provided to the semiconductor memory device 920, and perform a suitable circuit operation.

As described above, the semiconductor memory device in accordance with the embodiment of the present invention may perform the optimized alignment operation according to the normal operation mode or the state loading operation mode. Furthermore, the semiconductor memory device may detect the input speed of data using the data inputted from outside, and change the operation mode based on the detection result.

As the semiconductor memory device processes data through the optimized circuit operation, the operation efficiency of the semiconductor memory device may be improved.

Although various embodiments have been described for illustrative purposes, it will be apparent to those skilled in the art that various changes and modifications may be made without departing from the spirit and scope of the invention as defined in the following claims.

What is claimed is:

1. A semiconductor memory device comprising:
   a data alignment signal generation unit suitable for generating an alignment signal corresponding to an input speed of data;
   a data alignment unit suitable for aligning the data in response to the alignment signal to output aligned data;
   a state data storage unit suitable for storing the aligned data in response to a control signal that is activated at a given time; and
   a detection unit suitable for detecting the input speed of the data which toggle at a preset cycle,
   wherein the detection unit comprises:
   a first latching unit suitable for latching the data in response to a rising edge of a clock;
   a second latching unit suitable for latching the data in response to a falling edge of the clock; and
   a comparison unit suitable for comparing the data latched in the first and second latching units and outputting a mode signal denoting an operation mode corresponding to the input speed of the data.

2. The semiconductor memory device of claim 1, wherein the data alignment signal generation unit comprises:
   a plurality of signal generation units suitable for generating first and second alignment signals in response to an internal clock signal; and
   a select output unit suitable for outputting the alignment signal by selecting one of the first and second alignment signals in response to a mode signal denoting an operation mode corresponding to the input speed of the data.

3. The semiconductor memory device of claim 2, wherein the select output unit selects the first alignment signal during a normal operation mode, and selects the second alignment signal during a state loading operation mode, and
   the second alignment signal includes a plurality of pulse signals which are sequentially shifted in response to the internal clock signal.

4. The semiconductor memory device of claim 1, further comprising:
   a control signal generation unit suitable for generating the control signal in response to a mode signal denoting an operation mode corresponding to the input speed of the data; and
   a data transmission unit suitable for transmitting the aligned data to the state data storage unit in response to the control signal.

5. The semiconductor memory device of claim 1, wherein the state data storage unit comprises a mode register set.

6. A semiconductor system comprising:
   a semiconductor memory device suitable for detecting an input speed of data inputted thereto using the data, and aligning the data in response to the input speed of the data; and a controller suitable for providing the data and controlling the semiconductor memory device, wherein the semiconductor memory device comprises:

a detection unit suitable for detecting the input speed of the data to output a mode signal denoting an operation mode corresponding to the input speed of the data;

a data alignment signal generation unit suitable for generating an alignment signal in response to the mode signal;

a data alignment unit suitable for aligning the data in response to the alignment signal to output aligned data; and a state data storage unit suitable for storing the aligned data in response to a control signal which is activated at a given time, wherein the detection unit comprises:

a first latching unit suitable for latching the data in response to a first edge of a clock;

a second latching unit suitable for latching the data in response to a second edge of the clock; and a comparison unit suitable for comparing the data latched in the first and second latching units and outputting the mode signal.

7. The semiconductor system of claim 6, wherein the alignment signal generation unit comprises:

a plurality of signal generation units suitable for generating first and second alignment signals in response to an internal clock signal; and a select output unit suitable for outputting the alignment signal by selecting one of the first and second alignment signals in response to the mode signal.

8. The semiconductor system of claim 7, wherein the select output unit selects the first alignment signal during a normal operation mode, and selects the second alignment signal during a state loading operation mode, and the second alignment signal includes a plurality of pulse signals which are sequentially shifted in response to the internal clock signal.

9. The semiconductor system of claim 6, further comprising:

a control signal generation unit suitable for generating the control signal in response to the mode signal; and a data transmission unit suitable for transmitting the aligned data to the state data storage unit in response to the control signal.

10. The semiconductor system of claim 6, wherein the state data storage unit comprises a mode register set.

* * * * *

UNITED STATES PATENT AND TRADEMARK OFFICE
CERTIFICATE OF CORRECTION

| | |
|---|---|
| PATENT NO. | : 9,672,896 B2 |
| APPLICATION NO. | : 14/731175 |
| DATED | : June 6, 2017 |
| INVENTOR(S) | : Ki-Chang Chun |

It is certified that error appears in the above-identified patent and that said Letters Patent is hereby corrected as shown below:

Change the title section as follows:

(54) SEMICONDUCTOR MEMORY DEVICE INCLUDING A CIRCUIT FOR STORING AN OPERATING STATE AND SEMICONDUCTOR SYSTEM HAVING THE SAME

Signed and Sealed this
Twenty-fifth Day of July, 2017

Joseph Matal
*Performing the Functions and Duties of the*
*Under Secretary of Commerce for Intellectual Property and*
*Director of the United States Patent and Trademark Office*